(12) United States Patent
Kishida

(10) Patent No.: US 7,579,907 B2
(45) Date of Patent: Aug. 25, 2009

(54) SWITCHING AMPLIFIER

(75) Inventor: Masahiro Kishida, Yaita (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/494,450

(22) Filed: Jul. 28, 2006

(65) Prior Publication Data

US 2007/0146067 A1 Jun. 28, 2007

(30) Foreign Application Priority Data

Dec. 27, 2005 (JP) ............................. 2005-373860
Dec. 27, 2005 (JP) ............................. 2005-373866

(51) Int. Cl.
*H03F 3/38* (2006.01)

(52) U.S. Cl. ..................... 330/10; 330/207 A
(58) Field of Classification Search ................... 330/10, 330/207 A, 251

See application file for complete search history.

(56) References Cited

U.S. PATENT DOCUMENTS

| | | | |
|---|---|---|---|
| 3,883,778 A | 5/1975 | Kaji et al. | |
| 5,049,836 A | 9/1991 | Christie et al. | |
| 6,683,494 B2 * | 1/2004 | Stanley ........................ | 330/10 |
| 6,853,242 B2 * | 2/2005 | Melanson et al. ............. | 330/10 |
| 7,330,069 B2 * | 2/2008 | Yamamura et al. ............ | 330/10 |
| 2002/0180518 A1 | 12/2002 | Midya et al. | |
| 2005/0168269 A1 | 8/2005 | Tamura et al. | |

FOREIGN PATENT DOCUMENTS

JP 2000-295049 A 10/2000

OTHER PUBLICATIONS

Huang, Kuang-Hu et al; "A 2-V 7.2° Jitter AM-Suppression CMOS Amplifier Using Current-Mode Hybrid Magnitude Control", IEEE Journal of Solid State Circuits, IEEE Service Center, Piscataway, NJ, U.S., vol. 34, No. 10, Oct. 1999, pp. 1373-1380, XP000947104, ISSN: 0018-9200.

* cited by examiner

*Primary Examiner*—Robert Pascal
*Assistant Examiner*—Hieu P Nguyen
(74) *Attorney, Agent, or Firm*—Birch, Stewart, Kolasch & Birch, LLP

(57) ABSTRACT

A switching amplifier of the invention boasts of an enhanced SN ratio in its output and an increased amplitude limit value in its input signal. The switching amplifier has a quantized signal generating section that converts an input signal to generate a quantized signal in the form of a PDM or PWM signal and a constant-current-outputting current amplification section that current-amplifies the quantized signal outputted from the quantized signal generating section. The quantized signal generating section and the current amplification section are formed by the same process. Another switching amplifier of the invention is inexpensive and is not affected by voltage fluctuations in the supply voltage. The switching amplifier has a quantized signal generating section that converts an input signal to generate a quantized signal in the form of a PDM or PWM signal, a constant-current-outputting current amplification section that current-amplifies the quantized signal outputted from the quantized signal generating section, and a feedback section for feeding a signal based on the output signal from the current amplification section back to the quantized signal generating section.

9 Claims, 5 Drawing Sheets

SWITCHING AMPLIFIER

This nonprovisional application claims priority under 35 U.S.C. § 119(a) on pending Patent Publications Nos. 2007-180644 and 2007-180645 both filed in Japan on Dec. 27, 2005, the entire contents of which are hereby incorporated by reference.

BACKGROUND OF THE INVENTION

1. Field of the Invention

The present invention relates to a switching amplifier that power-amplify and then outputs a quantized signal, like a PDM (Pulse Density Modulation) signal or a PWM (Pulse Width Modulation) signal, obtained by conversion from an analog signal or a one-bit signal.

2. Description of Related Art

A one-bit signal obtained by delta sigma modulation of an analog signal or a one-bit signal has the advantage of allowing the frequency characteristics thereof to be set to suit a sound source or the like through proper selection of the circuit constants of integrators and adders included in the delta sigma modulation circuit that performs the delta sigma modulation. This helps broaden the effective frequency range or the dynamic range. For this reason, new standards for CDs (compact discs) and SACDs (super-audio compact discs) adopt a one-bit signal for the recording of an audio signal; in practice, products conforming thereto have been commercially available. A one-bit signal is used not only for such recording of an audio signal but also for power amplification and for signal transmission between appliances.

A switching amplifier that power-amplify a one-bit signal obtained by delta sigma modulation feeds it, as it is, to the control terminal of a semiconductor power amplifier device so as to obtain high-voltage switching pulses based on the output of the semiconductor power amplifier device. Simply by passing these switching pulses through a low pass filter, it is also possible to obtain a power-amplified demodulated analog signal.

In addition, since the semiconductor power amplifier device is controlled with a one-bit signal obtained by delta sigma modulation, it operates in a nonlinear region (saturated region) thereof, rather than in a linear region (unsaturated region) as in an analog amplifier. Thus, a switching amplifier that power-amplifiers a one-bit signal obtained by delta sigma modulation has the advantage of being capable of highly efficient power amplification; in practice, products exploiting it have been commercially available.

An example of the electrical configuration of a conventional switching amplifier that power-amplifies a one-bit signal obtained by delta sigma modulation (see FIG. 7 of JP-A-2000-295049) is shown in FIG. 6.

The switching amplifier shown in FIG. 6 is composed of an input terminal 1, an adder 2, a delta sigma modulation circuit 3, a pulse amplifier 6 to which a constant voltage is applied by a constant-voltage power supply 7, a low pass filter 8, an output terminal 9 and an attenuator 10. The delta sigma modulation circuit 3 is composed of an integrator/adder group 4 and a quantizer 5. Here, the integrator/adder group 4 is provided with a plurality of integrators connected in cascade arrangement for integrating one portion after another of the signal inputted thereto, and an adder for adding up the outputs of the individual integrators. The quantizer 5 quantizes the signal outputted from the adder included in the integrator/adder group 4 to convert it into a one-bit signal.

An input signal (an analog signal or a one-bit signal) $S_{IN}$ inputted from an input signal source (unillustrated) via the input terminal 1 is supplied to the adder 2. A feedback signal $S_{FB}$ outputted from the attenuator 10 is also supplied to the adder 2. The adder 2 supplies the signal that is obtained by subtracting the feedback signal $S_{FB}$ from the input signal $S_{IN}$ to the delta sigma modulation circuit 3.

The delta sigma modulation circuit 3 converts the signal supplied from the adder 2 into a one-bit signal $S_Q$, and sends the one-bit signal $S_Q$ to the pulse amplifier 6. The pulse amplifier 6 has a switching device such as a FET (unillustrated), and switches the switching device according to the one-bit signal $S_Q$ so as to power-amplify the one-bit signal $S_Q$. The pulse amplifier 6 then sends the power-amplified one-bit signal to the low pass filter 8 and the attenuator 10. The output signal from the pulse amplifier 6 has the high-frequency components thereof eliminated by a low pass filter 8 to become an output signal $S_{OUT}$, which is an analog signal. The output signal $S_{OUT}$ is then outputted via the output terminal 9. On the other hand, the output signal from the pulse amplifier 6 is attenuated by the attenuator 10 and thereby becomes the feedback signal $S_{FB}$.

The pulse amplifier 6 that power-amplifies the one-bit signal $S_Q$ provides a balanced output by use of an H-bridge circuit as shown in FIG. 7. The switching device included in the pulse amplifier 6, even when it is a MOS type switching device, is formed by a process such as a Bi-CMOS or DMOS (Double diffused MOS) process so as to withstand high voltages and large currents. On the other hand, the delta sigma modulation circuit 3 provided in the stage preceding the pulse amplifier 6 is formed by a CMOS process. Thus, the pulse amplifier 6 and the delta sigma modulation circuit 3 are formed by different processes, and accordingly they are not integrated into the same semiconductor chip.

Thus, the distance from the delta sigma modulation circuit 3 to the pulse amplifier 6 or to a feedback section is rather long. The resulting parasitic capacitance, wiring resistance and the like across the signal path cause a blunting of the signal waveform and a signal delay across the signal path. Disadvantageously, this lowers the SN ratio of the output of the switching amplifier, and lowers the amplitude limit value of the input signal $S_{IN}$ to the delta sigma modulation circuit 3. Moreover, variations in the capacitances and impedances that determine the circuit constants of the integrators and adder included in the integrator/adder group 4 provided in the delta sigma modulation circuit 3, and also variations in the impedance of the wiring in the feedback section through which a signal based on the output signal from the pulse amplifier 6 is fed back to the delta sigma modulation circuit 3, cause variations in the pulse width of the output signal from the pulse amplifier 6.

In the pulse amplifier 6 that power-amplifies the one-bit signal $S_Q$, as described above, a balanced output is provided by use of the H-bridge circuit as shown in FIG. 7. Here, the configuration adopted is such that the output is little affected by fluctuations in the supplied voltage V that is switched (the output voltage of the constant-voltage power supply 7). To reproduce an audio signal at a high output power, however, the H-bridge circuit as shown in FIG. 7 requires at least four very expensive amplifier devices that withstand high voltages and large currents. Furthermore, since the H-bridge circuit shown in FIG. 7 switches the direction of the output current so as to provide the balanced output, a dead time needs to be provided so as to prevent a through current from being generated when the direction of the output current is switched. Disadvantageously, this dead time causes distortion in the reproduced sound.

Moreover, in the switching amplifier shown in FIG. 6, in a case where the H-bridge circuit as shown in FIG. 7 is used in the pulse amplifier 6 that power-amplify the one-bit signal $S_Q$, the one-bit signal $S_Q$ serving as a switching control signal needs to be somehow (for example, see JP-A-2002-208824) prevented from becoming indeterminate at the start of operation when the feedback loop, from the delta signal modulation circuit 3 to the pulse amplifier 6 to the attenuation circuit 10 and to the adder 2, is cut, because otherwise the switching device included in the pulse amplifier 6 breaks down.

SUMMARY OF THE INVENTION

It is a first object of the present invention to provide a switching amplifier that permits an improvement in the SN ratio of the output of the switching amplifier and that permits an increase in the amplitude limit value of the input signal thereof.

It is a second object of the present invention to provide an inexpensive switching amplifier that is not affected by voltage fluctuations in the supplied voltage.

To achieve the first object, according to the present invention, a switching amplifier is provided with: a quantized signal generating section that converts an input signal to generate a quantized signal in the form of a PDM signal or a PWM signal; and a constant-current-outputting current amplification section that current-amplifies the quantized signal outputted from the quantized signal generating section. Here, the quantized signal generating section and the current amplification section are formed by the same process (the first configuration).

With the first configuration, it is possible to integrate the quantized signal generating section and the current amplification section into the same chip, and it is thereby possible to make shorter the signal path between the quantized signal generating section and the current amplification section. Thus, it is possible to reduce the lowering of the SN ratio of the output and to reduce the lowering of the amplitude limit value of the input signal attributable to a signal delay across the signal path. Moreover, since the quantized signal generating section and the current amplification section can be integrated into the same chip, it is possible to reduce the variation of the circuit components included in the quantized signal generating section with respect to the current amplification section, and thereby to reduce the variation of the algorithm of the quantized signal generating section with respect to the current amplification section. This makes it possible to reduce sound quality deterioration attributable to the lowering of the SN ratio of the output of the switching amplifier and the like. Furthermore, since the quantized signal generating section and the current amplification section can be integrated into the same chip, it is possible to achieve miniaturization.

With the first configuration, the output of the current amplification section is a constant current, and is therefore practically not at all affected by fluctuations in the supplied voltage. Since the constant-current-outputting current amplification section is inexpensive compared to the H-bridge circuit used conventionally, it is possible to achieve a significant cost reduction. Thus, with the first configuration, the second object is also achieved.

With the first configuration, even if the quantized signal outputted from the quantized signal generating section becomes indeterminate at the start of operation, the current amplification section amplifies only the current component of the waveform that corresponds to the indeterminate quantized signal, and it is not necessary to switch the direction of the current to provide a balanced output. This prevents a through current from flowing. Thus, even if the quantized signal outputted from the quantized signal generating section becomes indeterminate at the start of operation, it is possible to prevent breakdown of a device included in the current amplification section.

The switching amplifier with the first configuration may be further provided with a feedback section that feeds a signal based on the output signal from the current amplification section back to the quantized signal generating section. Here, the quantized signal generating section, the current amplification section and the feedback section may be formed by the same process. With this configuration (the second configuration), it is possible to integrate the quantized signal generating section, the current amplification section and the feedback section on the same chip, and thereby to make shorter the length of the path in the feedback section. Thus, it is possible to reduce high-frequency switching noise or the like generated in the current amplification section, and thereby to improve the distortion rate and the SN ratio of the current amplification section itself. Since the current amplification section and the feedback section can be integrated into the same chip, it is possible to reduce the variation of the impedance of the wiring in the feedback section with respect to the current amplification section, and to prevent the variation of the pulse width of the output signal of the current amplification section and the variation of the signal delay with respect to the current amplification section. This makes it possible to prevent sound quality deterioration attributable to the lowering of the SN ratio of the output of the switching amplifier or the like. Since the quantized signal generating section, the current amplification section and the feedback section can be integrated into the same chip, it is possible to achieve miniaturization.

In the switching amplifier with the first configuration or the second configuration, it is preferable that the above-mentioned same process be the same CMOS process. With this configuration (the third configuration), it is possible to achieve significant cost reduction without use of an expensive process such as Bi-CMOS or DMOS.

To achieve the first object, according to the present invention, a switching amplifier is provided with: a quantized signal generating section that converts an input signal to generate a quantized signal in the form of a PDM signal or a PWM signal; and a constant-current-outputting current amplification section that current-amplifies the quantized signal outputted from the quantized signal generating section. Here, the quantized signal generating section and the current amplification section are integrated on the same chip (the fourth configuration). The switching amplifier with the fourth configuration may be further provided with a feedback section that feeds a signal based on the output signal from the current amplification section back to the quantized signal generating section. Here, the quantized signal generating section, the current amplification section and the feedback section may be integrated in the same chip (the fifth configuration).

With the fourth configuration, it is possible to make shorter the signal path between the quantized signal generating section and the current amplification section, and thereby to reduce the lowering of the SN ratio of the output and to reduce the lowering of the amplitude limit value of the input signal attributable to the signal delay in the signal path. Moreover, it is possible to reduce the variation of the circuit components included in the quantized signal generating section with respect to the current amplification section, and thereby to reduce the variation of the algorithm of the quantized signal generating section with respect to the current amplification section. This makes it possible to prevent sound quality deterioration attributable to the lowering of the SN ratio of the output of the switching amplifier and the like. Thus, it is possible to achieve miniaturization.

With the fifth configuration, it is possible to prevent the variation of the impedance of the wiring in the feedback section with respect to the current amplification section, and to prevent the variation of the pulse width of the output signal of the current amplification section and the variation of the signal delay with respect to the current amplification section. This makes it possible to prevent sound quality deterioration attributable to the lowering of the SN ratio of the output of the switching amplifier or the like.

To achieve the second object, according to the present invention, a switching amplifier is provided with: a quantized signal generating section that converts an input signal to generate a quantized signal in the form of a PDM signal or a PWM signal; a constant-current-outputting current amplification section that current-amplifies the quantized signal outputted from the quantized signal generating section; and a feedback section that feeds a signal based on the output signal from the current amplification section to the quantized signal generating section (the sixth configuration).

With the sixth configuration, the output of the current amplification section is a constant current, and is therefore practically not at all affected by fluctuations in the supplied voltage. Since the constant-current-outputting current amplification section is inexpensive compared to the H-bridge circuit used conventionally, it is possible to achieve significant cost reduction. Thus, it is possible to realize an inexpensive switching amplifier that is not affected by voltage fluctuations in the supplied voltage.

With the sixth configuration, even if the quantized signal outputted from the quantized signal generating section becomes indeterminate at the start of operation, the current amplification section amplifies only the current component of the waveform that corresponds to the indeterminate quantized signal, and it is not necessary to switch the direction of the current to provide a balanced output. This prevents a through current from flowing. Thus, even if the quantized signal outputted from the quantized signal generating section becomes indeterminate at the start of operation, it is possible to prevent breakdown of a device included in the current amplification section.

With the sixth configuration, it is possible to reduce high-frequency switching noise or the like generated in the current amplification section, and to improve the distortion rate or the SN ratio of the current amplification section itself.

In the switching amplifier with the sixth configuration, the current amplifier section may be provided with a constant-current-outputting CMOS logic buffer or a constant-current-outputting inverter (the seventh configuration). Since a constant-current-outputting CMOS logic buffer and a constant-current-outputting inverter are both widely available inexpensive circuits, it is possible to easily realize an inexpensive constant-current-outputting current amplifier by use of them.

In the switching amplifier with the sixth configuration or the seventh configuration, a plurality of values may be set for the constant current outputted from the current amplification section (the eighth configuration). This permits modification of the output specifications of the switching amplifier.

In a case where a plurality of values are set for the constant current outputted from the current amplification section, for example, it is preferable that the current amplification section be provided with a plurality of constant-current-outputting current amplification circuits that are connected in parallel with one another and a switching section for switching the number of, of the current amplification circuits, those to which a drive voltage is supplied (the ninth configuration). The switching amplifier with the ninth configuration may be further provided with a volume controller that outputs a volume control signal according to volume-controlling operation performed by the operator so that the switching section switches the number of, of the current amplification circuits, those to which the drive voltage is supplied according to the volume control signal (the tenth configuration). Thus, it is possible to increase or decrease the output power of the switching amplifier according to the volume-controlling operation performed by the operator.

In the switching amplifier with one of the sixth to the tenth configurations, no frequency range limiting means need be provided in the stage succeeding the current amplification section. Thus, it is possible to obtain clear reproduced sound with little distortion without being affected by an electric power loss attributable to the impedance of an inductance included in the frequency range limiting means, and without being affected by distortion or the like attributable to the counter electromotive force or magnetic saturation of the inductance.

DETAILED DESCRIPTION OF PREFERRED EMBODIMENTS

Figure 1:
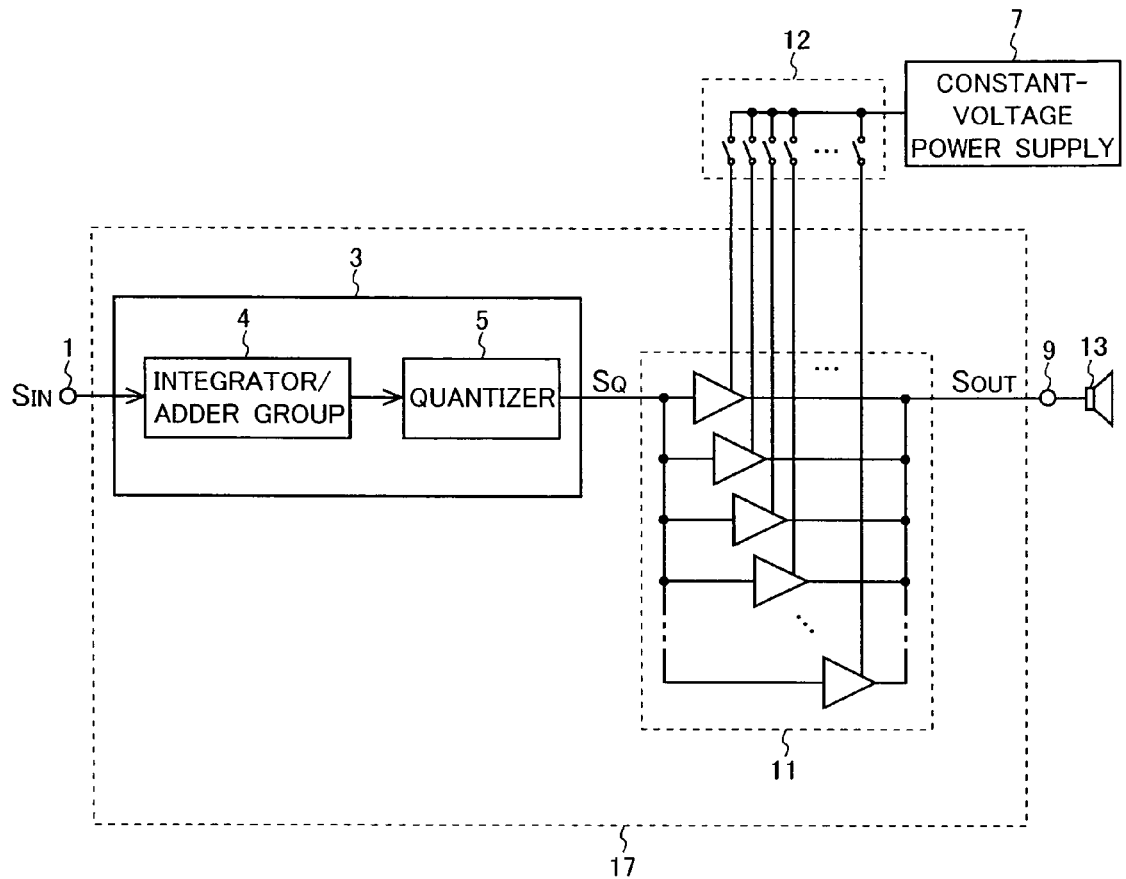
FIG. 1 is a diagram showing the electrical configuration of the switching amplifier of a first embodiment of the present invention.
Figure 6:
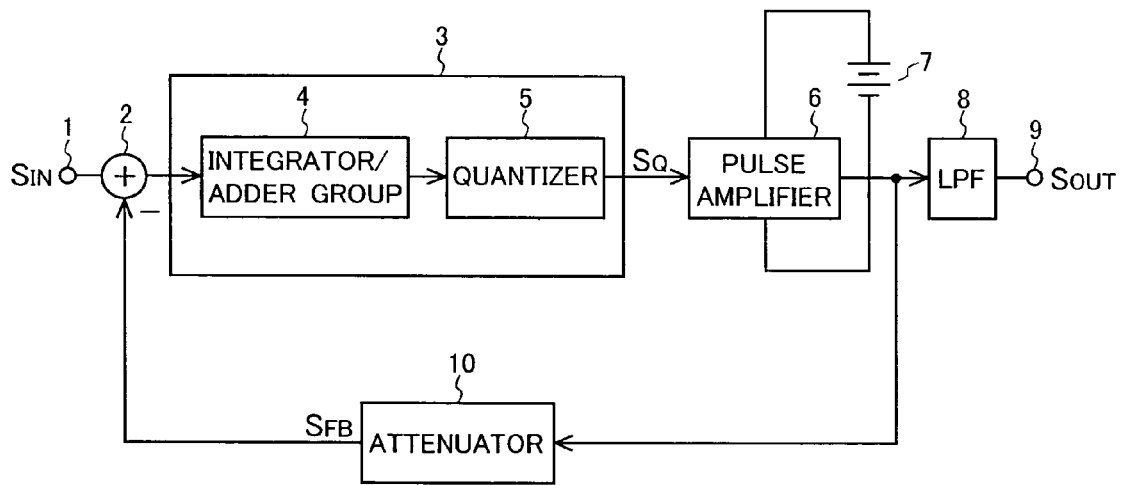
FIG. 6 is a diagram showing an example of the electrical configuration of a conventional switching amplifier.
Figure 7:
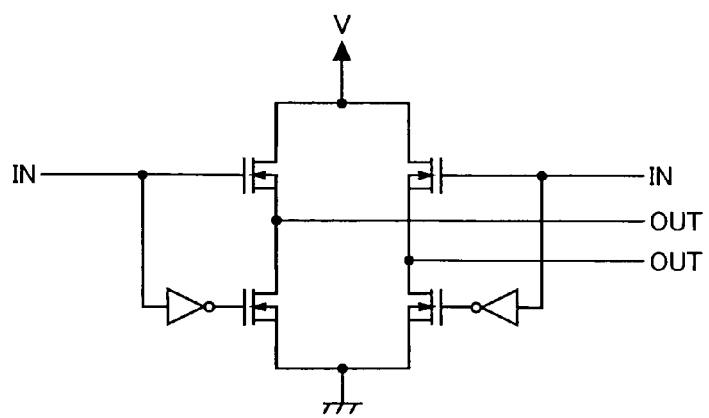
FIG. 7 is a diagram showing an example of the configuration of an H-bridge circuit.

Hereinafter, embodiments of the present invention will be described with reference to the accompanying drawings. First, a first embodiment of the present invention will be described. FIG. 1 shows the electrical configuration of the switching amplifier of the first embodiment of the present invention. It should be noted that, in FIG. 1, such parts as are found also in FIG. 6 are identified with common reference numerals.

The switching amplifier shown in FIG. 1 is a switching amplifier that power-amplifies a one-bit signal obtained by delta sigma modulation. The switching amplifier is composed of: an input terminal 1; a delta sigma modulation circuit 3 for generating a one-bit signal; a current amplification section 11 to which a constant voltage is applied by a constant-voltage power supply 7; a switching section 12 for switching the electrical interconnection among individual current amplification circuits included in the current amplification section 11 and the constant-voltage power supply 7; and an output terminal 9. The delta sigma modulation circuit 3 is composed of an integrator/adder group 4 and a quantizer 5. Here, the integrator/adder group 4 is provided with a plurality of integrators connected in cascade arrangement for integrating one portion after another of the signal inputted thereto, and an adder for adding up the outputs of the individual integrators. The quantizer 5 quantizes the signal outputted from the adder included in the integrator/adder group 4 to convert it into a one-bit signal. A speaker 13 is connected to the output terminal 9 so as to be removable.

An input signal (an analog signal or a one-bit signal) $S_{IN}$ inputted from an input signal source (unillustrated) via the input terminal 1 is supplied to the delta sigma modulation circuit 3. The delta sigma modulation circuit 3 converts the signal inputted via the input terminal 1 into a one-bit signal $S_Q$ in the form of a PDM signal or a PWM signal, and sends the one-bit signal $S_Q$ to the current amplification section 11. The current amplification section 11 is composed of a plurality of constant-current-outputting current amplification circuits (for example, constant-current-outputting CMOS logic buffers or constant-current-outputting inverters) connected in parallel with one another. The current amplification section 11 current-amplifies (power-amplifies) the one-bit signal $S_Q$ outputted from the delta sigma modulation circuit 3, and then sends the current-amplified (power-amplified) one-bit signal $S_{OUT}$ to the output terminal 9. Then, the one-bit signal $S_{OUT}$ from the switching amplifier shown in FIG. 1 is, as the output signal thereof, fed to the speaker 13 connected to the output terminal 9.

Figure 2:
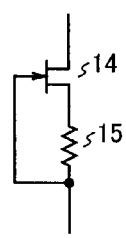
FIG. 2 is a diagram showing an example of the electrical configuration of a constant current circuit.

A constant-current-outputting current amplification circuit has a constant current circuit in the final stage thereof. As an example of the electrical configuration of the constant current circuit, the circuit configuration shown in FIG. 2 is taken up in which the drain of an N-channel JFET (junction type field effect transistor) 14 is connected via a resistor 15 to the gate thereof. Since the current value of the one-bit signal $S_{OUT}$ outputted from the current amplification section 11 is the sum of the currents outputted from the constant-current-outputting current amplification circuits, the current value is not affected by voltage fluctuations in the constant-voltage power supply 7. Moreover, the constant-current-outputting current amplification circuits are very inexpensive. Thus, it is possible to achieve a significant cost reduction in the switching amplifier shown in FIG. 1 compared to the switching amplifier shown in FIG. 6 that incorporates an H-bridge circuit.

In addition, the switching section 12 switches the electrical interconnection among the individual current amplification circuits included in the current amplification section 11 and the constant-voltage power supply 7 so as to modify the number of driven current amplification circuits. Accordingly, the current value of the one-bit signal $S_{OUT}$ outputted from the current amplification section 11 varies. This allows the output specifications of the switching amplifier to be switched easily.

It should be noted that although the current amplification section 11 in the switching amplifier shown in FIG. 1 has a plurality of current amplification circuits, the present invention is not limited to such a configuration. The current amplification section may include only one current amplification circuit so long as the current amplification circuit has a current capacity required in the current amplification section 11. The switching section 12 may be omitted so that the current value of the one-bit signal $S_{OUT}$ outputted from the current amplification section 11 is fixed.

Now, the relationship between the current capacity required in the current amplification section 11 and the number of current amplification circuits provided in the current amplification section 11 will be described.

The electric power value of the output signal of the switching amplifier shown in FIG. 1, namely, the output power of the switching amplifier shown in FIG. 1 depends on the output voltage of the constant-voltage power supply 7 that drives the current amplification section 11 and the impedance of the speaker 13 connected to the output terminal 9. Let the output power of the switching amplifier shown in FIG. 1 be P [W], the impedance of the speaker 13 be R [Ω], and the output voltage of the constant-voltage power supply 7 be V [V], then the output power P of the switching amplifier shown in FIG. 1 is given by the following equation (1):

$$P = \frac{\left(\frac{V}{\sqrt{2}}\right)^2}{R} \quad (1)$$

Let the output current of the switching amplifier shown in FIG. 1 be I [A], then, since $P = I^2 \cdot R$, the following equation (2) holds:

$$I = \sqrt{\frac{P}{R}} \quad (2)$$

Consider, for example, a case where the current amplification section 11 has a sufficient current capacity, the output voltage of the constant-voltage power supply 7 is 5 [V], and the speaker 13 is a four-ohm speaker, then, according to the equation (1), the output power P of the switching amplifier shown in FIG. 1 is calculated as follows:

$$P = \frac{\left(\frac{5}{\sqrt{2}}\right)^2}{4}$$
$$= 3.125 \, [W]$$

Here, according to the equation (2), the current capacity $I_{REQ}$ required in the current amplification section 11 is calculated as follows:

$$I_{REQ} = \sqrt{\frac{3.125}{4}}$$
$$\approx 884 \, [mA]$$

Let the number of current amplification circuits connected in parallel with one another in the current amplification section 11 be N, and the current capacity of each current amplification circuit be i [A], then, when the N current amplification circuits are all driven, the following equation (3) holds:

$$N = I/i \quad (3)$$

Consider, for example, a case where the current capacity i of the current amplification circuit is 25 [mA], then, according to the equation (3), the number N of constant current amplification circuits is calculated as follows:

$$N = 884/25 \approx 36$$

As described above, it is advisable to set the number N of current amplification circuits connected in parallel with one another in the current amplification section 11 so as to suit the impedance of the speaker 13 connected to the output terminal 9. In other words, it is advisable to determine the number N of current amplification circuits connected in parallel with one another in the current amplification section 11 so as to suit the speaker with the lowest practicable impedance.

In the switching amplifier shown in FIG. 1, the one-bit signal $S_{OUT}$ outputted from the current amplification section 11 is supplied via the output terminal 9 to the speaker 13 without having its frequency range limited by a low pass filter or the like. Thus, by adopting a configuration in which no frequency range limiting means such as a low pass filter is provided in the stage succeeding the current amplification section 11, it is possible to obtain clear reproduced sound with little distortion without being affected by an electric power loss attributable to the impedance of an inductance included in the frequency range limiting means, and without being affected by distortion or the like attributable to the counter electromotive force or magnetic saturation of the inductance. Though with somewhat lower quality in the reproduced sound, it is also possible to adopt a configuration in which frequency range limiting means such as a low pass filter is provided between the current amplification section 11 and the output terminal 9.

It is preferable to minimize the length of the connection path between the current amplification section 11 and the speaker 13. With this configuration, it is possible to reduce radiation into the air of the high-frequency noise generated in the connection path between the current amplification section 11 and the speaker 13.

The delta sigma modulation circuit 3 and the current amplification section 11 are formed by the same CMOS process, and are integrated into the same semiconductor chip 17. With this configuration, it is possible to make shorter the signal path between the delta sigma modulation circuit 3 and the current amplification section 11, and to reduce the lowering of the SN ratio of the output and to reduce the lowering of the amplitude limit value of the input signal attributable to the signal delay across the signal path. Moreover, it is possible to reduce the variation, with respect to the current amplification section 11, of the capacitances and impedances that determine the circuit constants of the integrators and the adder included in the in integrator/adder group 4 provided in the delta sigma modulation circuit 3, and thereby to reduce the variation of the algorithm of the delta sigma modulation circuit 3 with respect to the current amplification section 11. This makes it possible to reduce sound quality deterioration attributable to, for example, the lowering of the SN ratio of the output of the switching amplifier. It is also possible to achieve miniaturization. Furthermore, it is possible to achieve significant cost reduction since the delta sigma modulation circuit 3 and the current amplification section 11 are formed by the same CMOS process without use of an expensive process such as a Bi-CMOS or DMOS process.

Figure 3:
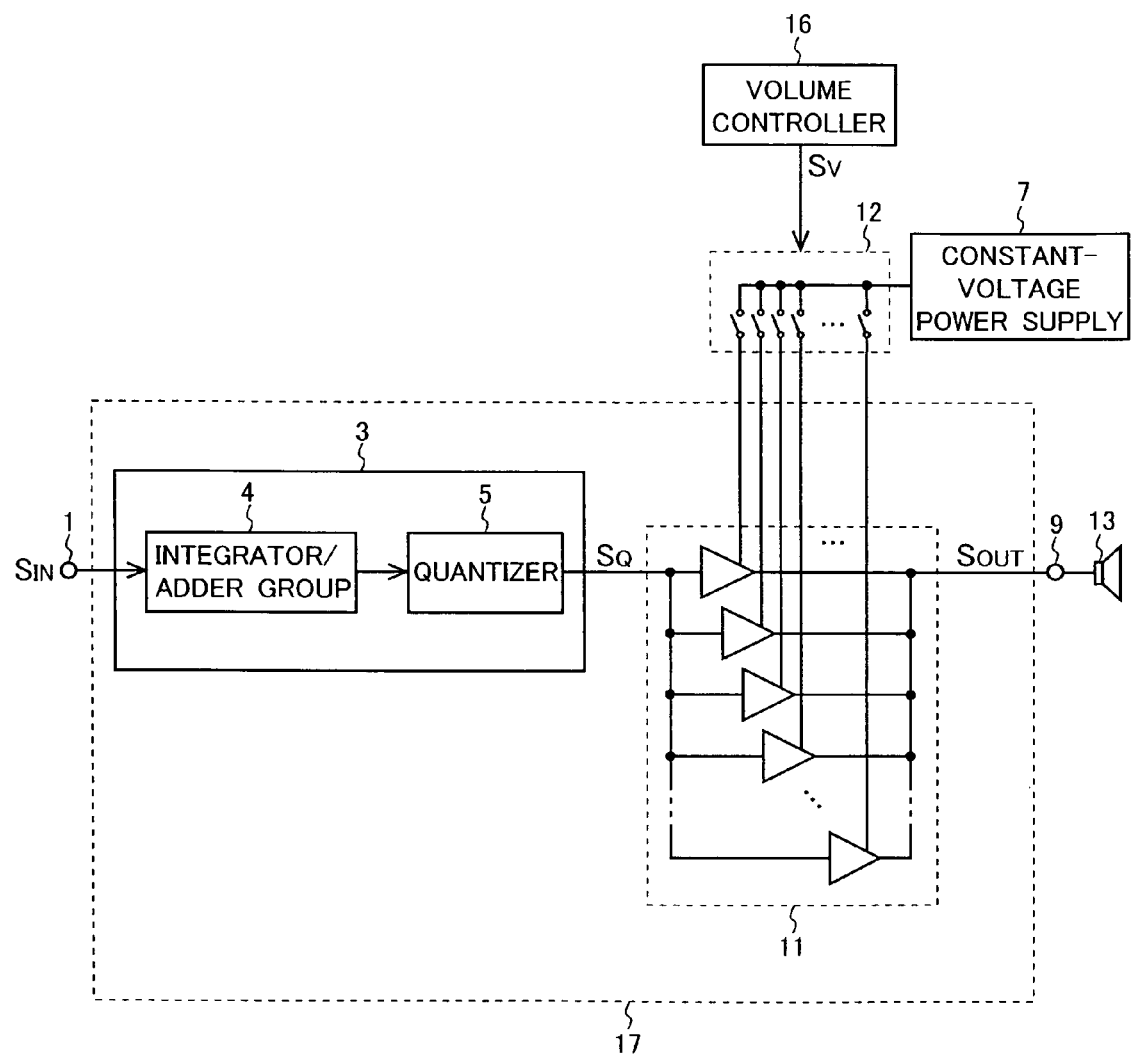
FIG. 3 is a diagram showing a modified example of the switching amplifier of the first embodiment of the present invention.

As in a modified example shown in FIG. 3, a volume controller 16 that outputs a volume control signal $S_V$ according to volume-controlling operation performed by the operator, may be provided so that the switching circuit 12 switches the electrical interconnection among the individual current amplification circuits included in the current amplification section 11 and the constant voltage source 7 according to the volume control signal $S_V$ and thereby increases or decreases the number of driven current amplification circuits. This makes it possible to increase or decrease the output power of the switching amplifier according to the volume-controlling operation performed by the operator.

Figure 4:
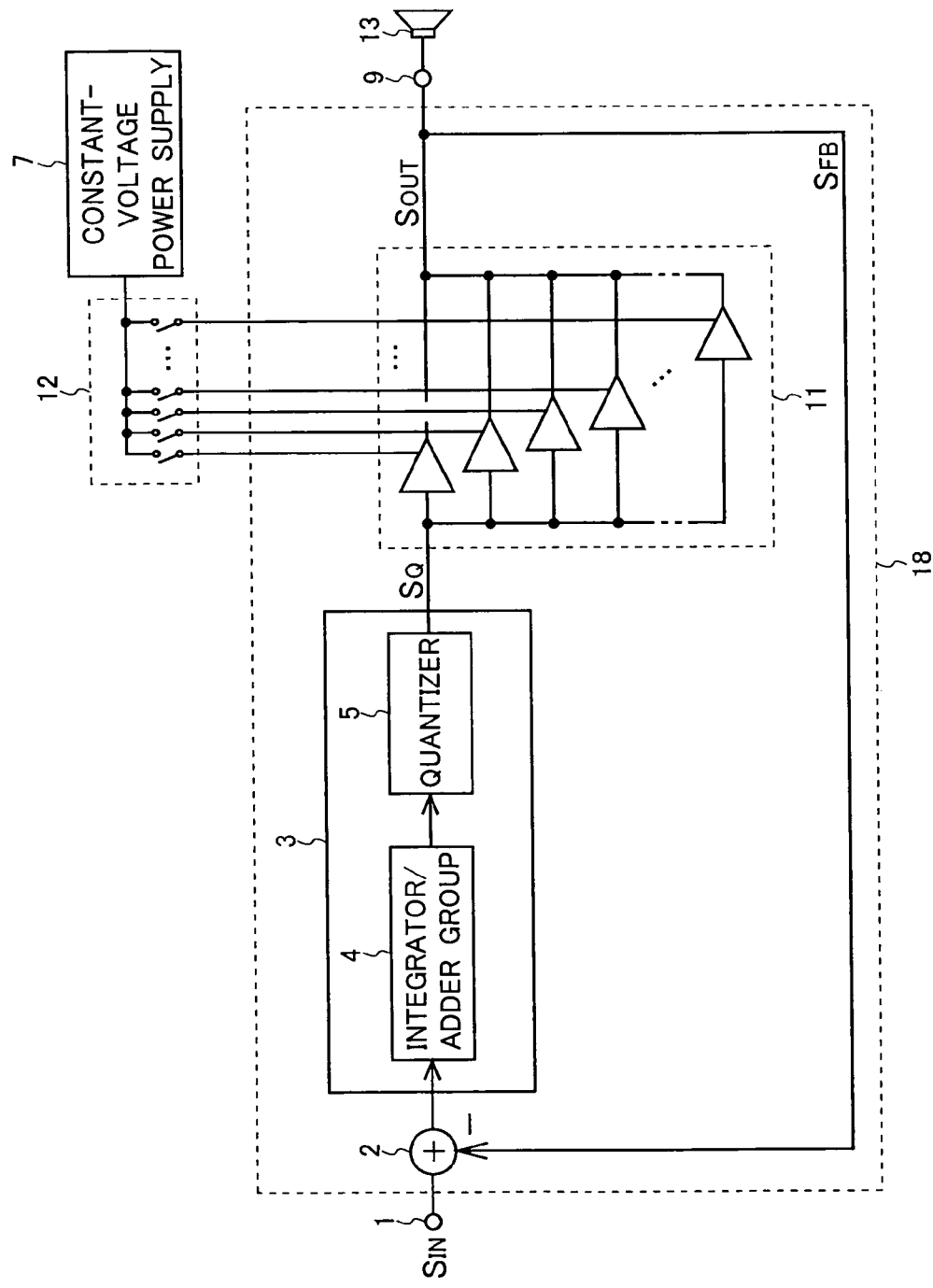
FIG. 4 is a diagram showing the electrical configuration of the switching amplifier of a second embodiment of the present invention.

Next, a second embodiment of the present invention will be described. FIG. 4 shows the electrical configuration of the switching amplifier of the second embodiment of the present invention. It should be noted that, in FIG. 4, such parts as are found also in FIG. 6 and FIG. 1 are identified with common reference numerals.

The switching amplifier shown in FIG. 4 is a switching amplifier that power-amplifies a one-bit signal obtained by delta sigma modulation. The switching amplifier is composed of: an input terminal 1; an adder 2; a delta sigma modulation circuit 3 for generating a one-bit signal; a current amplification section 11 to which a constant voltage is applied by a constant-voltage power supply 7; a switching section 12 for switching the electrical interconnection among individual current amplification circuit included in the current amplification section 11 and the constant-voltage power supply 7; and an output terminal 9. The delta sigma modulation circuit 3 is composed of an integrator/adder group 4 and a quantizer 5. Here, the integrator/adder group 4 is provided with a plurality of integrators connected in cascade arrangement for integrating one portion after another of the signal inputted thereto, and an adder for adding up the outputs of the individual integrators. The quantizer 5 quantizes the signal outputted from the adder included in the integrator/adder group 4 to convert it into a one-bit signal. A speaker 13 is connected to the output terminal 9 so as to be removable.

An input signal (an analog signal or a one-bit signal) $S_{IN}$ inputted from an input signal source (unillustrated) via the input terminal 1 is supplied to the adder 2. A feedback signal $S_{FB}$ is also supplied to the adder 2. The adder 2 supplies the signal that is obtained by subtracting the feedback signal $S_{FB}$ from the input signal $S_{IN}$ to the delta sigma modulation circuit 3.

The delta sigma modulation circuit 3 converts the signal inputted from the adder 2 into a one-bit signal $S_Q$ in the form of a PDM signal or a PWM signal, and sends the one-bit signal $S_Q$ to the current amplification section 11. The current amplification section 11 is composed of a plurality of constant-current-outputting current amplification circuits (for example, constant-current-outputting CMOS logic buffers or constant-current-outputting inverters) connected in parallel with one another. The current amplification section 11 current-amplifies (power-amplifies) the one-bit signal $S_Q$ outputted from the delta sigma modulation circuit 3, and then outputs the current-amplified (power-amplified) one-bit signal $S_{OUT}$. The one-bit signal $S_{OUT}$ is divided into two, one being supplied to the adder 2 as a feedback signal $S_{FB}$ and another being sent out to the output terminal 9. Then, the output signal of the switching amplifier shown in FIG. 4 is supplied to the speaker 13 connected to the output terminal 13.

The switching amplifier shown in FIG. 4 offers advantages similar to those offered by the switching amplifier shown in FIG. 1. In addition, since the switching amplifier shown in FIG. 4 divides the output signal $S_{OUT}$ from the current amplification section 11 into two of which one is fed back to the delta sigma modulation circuit 3, it offers further advantages of reducing high-frequency switching noise or the like generated in the current amplification section 11 and of improving the distortion rate or the SN ratio of the current amplification section 11 itself.

The adder 2, the delta sigma modulation circuit 3, the current amplification section 11, and the path of the feedback section are formed by the same CMOS process, and are integrated into the same semiconductor chip 18. With this configuration, it is possible to make shorter the signal path between the delta sigma modulation circuit 3 and the current amplification section 11, and to reduce the lowering of the SN ratio of the output and to reduce the lowering of the amplitude limit value of the input signal attributable to the signal delay across the signal path. Moreover, it is possible to reduce the variation, with respect to the current amplification section 11, of the capacitances and impedances that determine the circuit constants of the integrators and the adder included in the integrator/adder group 4 provided in the delta sigma modulation circuit 3, and thereby to reduce the variation of the algorithm of the delta sigma modulation circuit 3 with respect to the current amplification section 11. This makes it possible to reduce sound quality deterioration attributable to the lowering of the SN ratio of the output of the switching amplifier and the like. It is also possible to achieve miniaturization. Further, it is possible to achieve significant cost reduction, since the adder 2, the delta sigma modulation circuit 3, the current amplification section 11 and the path of the feedback section are formed by the same CMOS without the use of an expensive process such as a Bi-CMOS or DMOS process. Furthermore, it is possible to reduce the variation of the impedance of the wiring in the feedback section with respect to the current amplification section 11, and to prevent the variation of the pulse width of the output signal of the current amplification section 11 and the variation of the signal delay with respect to the current amplification section 11. This makes it possible to reduce sound quality deterioration attributable to the lowering of the SN ratio of the output of the switching amplifier or the like.

It is possible to adopt a configuration in which no frequency range limiting means such as a low pass filter is provided between the current amplification section 11 and the output terminal 9. In the conventional switching amplifier, when a balanced output is generated by an H-bridge circuit, large ringing occurs at the moments that the direction of the output current is switched. Thus, in the conventional switching amplifier, in a case where its configuration is such that no frequency range limiting means such as a low pass filter is provided, disadvantageously, the reproduced sound is severely distorted because the noise component resulting from ringing cannot be eliminated. In contrast, the switching amplifier according to the present invention is free from such a disadvantage even when its configuration is such that no frequency range limiting means such as a low pass filter is provided. On the contrary, with this very configuration involving no frequency range limiting means such as a low pass filter, it is possible to obtain clear reproduced sound with little distortion without being affected by an electric power loss attributable to the impedance of an inductance included in frequency range limiting means, and without being affected by distortion or the like attributable to the counter electromotive force or magnetic saturation of the inductance.

It is preferable to minimize the length of the connection path between the current amplification section 11 and the speaker 13. With this configuration, it is possible to reduce radiation into the air of the high-frequency noise generated in the connection path between the current amplification section 11 and the speaker 13.

Figure 5:
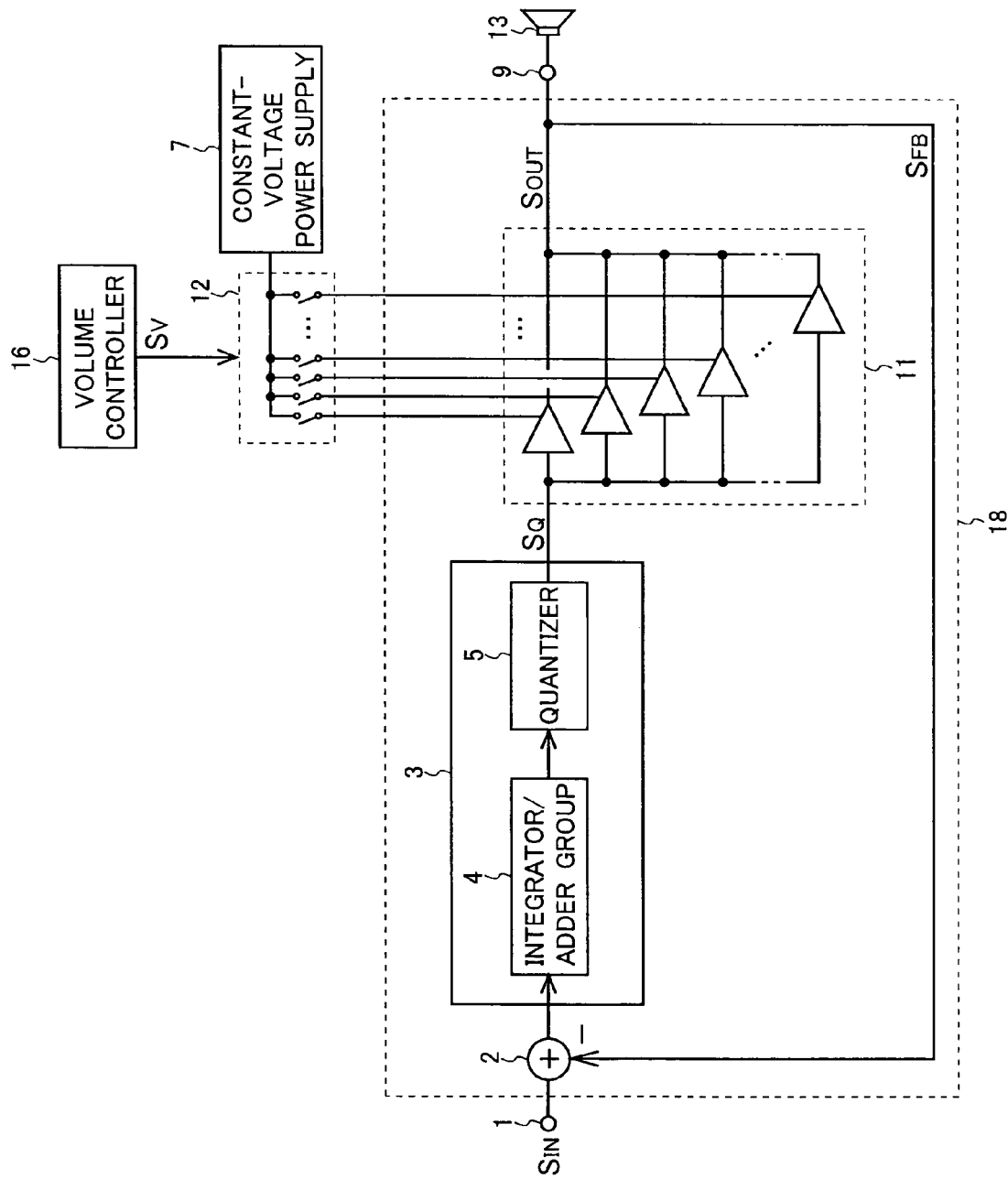
FIG. 5 is a diagram showing a modified example of the switching amplifier of the second embodiment of the present invention.

As in a modified example shown in FIG. 5, a volume controller 16 that outputs a volume control signal $S_V$ according to volume-controlling operation performed by the operator, may be provided so that the switching circuit 12 switches the electrical interconnection among the individual current amplification circuits included in the current amplification section 11 and the constant voltage source 7 according to the volume control signal $S_V$ and thereby increases or decreases the number of driven current amplification circuits. This makes it possible to increase or decrease the output power of the switching amplifier according to the volume-controlling operation performed by the operator.

Although, in the embodiments described above, the speaker 13 is driven only with the signal $S_{OUT}$ obtained by current-amplifying the one-bit signal $S_Q$, it is preferable to drive the speaker 13 with a differential signal between the signal $S_{OUT}$ and the inverted version $\overline{S_{OUT}}$ thereof obtained by similarly current-amplifying the inverted version $\overline{S_Q}$ of the one-bit signal $S_Q$. With this configuration, even if the constant-current-outputting current amplification circuits are changed from constant-current-outputting CMOS logic buffers to constant-current-outputting inverters, the above-mentioned differential signal remains identical.

What is claimed is:

1. A switching amplifier comprising:
a quantized signal generating section that converts an input signal to generate a quantized signal in a form of a PDM signal or a PWM signal;
a constant-current-outputting current amplification section that current-amplifies the quantized signal outputted from the quantized signal generating section; and
a feedback section that feeds a signal based on an output signal from the current amplification section back to the quantized signal generating section,
wherein the quantized signal generating section, the current amplification section and the feedback section are formed by a same process, and
the quantized signal generating section and the current amplification section are formed by a same process.

2. The switching amplifier of claim 1,
wherein the same process is a same CMOS process.

3. A switching amplifier comprising:
a quantized signal generating section that converts an input signal to generate a quantized signal in a form of a PDM signal or a PWM signal;
a constant-current-outputting current amplification section that current-amplifies the quantized signal outputted from the quantized signal generating section; and
a feedback section that feeds a signal based on an output signal from the current amplification section back to the quantized signal generating section,
wherein the quantized signal generating section, the current amplification section and the feedback section are integrated into a same chip, and
the quantized signal generating section and the current amplification section are integrated into a same chip.

4. A switching amplifier comprising:
a quantized signal generating section that converts an input signal to generate a quantized signal in a form of a PDM signal or a PWM signal;
a constant-current-outputting current amplification section that current-amplifies the quantized signal outputted from the quantized signal generating section; and
a feedback section that feeds a signal based on an output signal from the current amplification section back to the quantized signal generating section.

5. The switching amplifier of claim 4,
wherein the current amplification section includes a constant-current-outputting CMOS logic buffer or a constant-current-outputting inverter.

6. The switching amplifier of claim 4,
wherein a plurality of values are set for the constant current outputted from the current amplification section.

7. The switching amplifier of claim 6,
wherein the current amplification section includes a plurality of constant-current-outputting current amplification circuits and that are connected in parallel with one another, and the switching amplifier further includes a switching section that switches a number of, of the constant-current-outputting current amplification circuits, those to which a drive voltage is supplied.

8. The switching amplifier of claim 7,
wherein the switching amplifier further includes a volume controller that outputs a volume control signal according to volume-controlling operation performed by an operator, and the switching section switches the number of, of the constant-current-outputting current amplification circuits, those to which the drive voltage is fed according to the volume control signal.

9. The switching amplifier of claim 4,
wherein no frequency range limiting means is provided in a stage succeeding the current amplification section.

* * * * *